United States Patent
Haraguchi

[11] 4,218,736
[45] Aug. 19, 1980

[54] EFFECTIVE VALUE MEASURING APPARATUS

[75] Inventor: Hirofumi Haraguchi, Gyoda, Japan

[73] Assignee: Takeda Riken Kogyo Kabushikikaisha, Tokyo, Japan

[21] Appl. No.: 23,457

[22] Filed: Mar. 23, 1979

[30] Foreign Application Priority Data

Apr. 3, 1978 [JP] Japan .............................. 53-38953
Apr. 3, 1978 [JP] Japan .............................. 53-38954

[51] Int. Cl.² ...................... G01R 29/00; G06G 7/62
[52] U.S. Cl. ............................ 364/483; 364/487; 324/76 R; 364/807
[58] Field of Search .......... 364/483, 481, 487, 807; 324/76 R

[56] References Cited
U.S. PATENT DOCUMENTS

| | | | |
|---|---|---|---|
| 2,871,447 | 1/1959 | Hall | 364/481 X |
| 2,970,261 | 1/1961 | Zoll | 364/483 X |
| 3,205,347 | 9/1965 | Wright | 364/483 |
| 3,423,578 | 1/1969 | Platzer, Jr. et al. | 364/483 |
| 3,488,482 | 1/1970 | Ley | 364/483 |
| 3,743,949 | 7/1973 | Engel et al. | 364/483 X |
| 3,840,813 | 10/1974 | Allen et al. | 364/483 X |
| 4,006,348 | 2/1977 | Ochiai et al. | 364/481 |
| 4,073,008 | 2/1978 | Andow et al. | 364/483 X |

Primary Examiner—Edward J. Wise
Attorney, Agent, or Firm—Staas & Halsey

[57] ABSTRACT

A signal to be measured and a triangular signal are applied to a first mean square value circuit, in which they are added together, full-wave rectified and smoothed and, at the same time, the triangular signal and a measured output are provided to a second mean square value circuit, in which they are added together, full-wave rectified and smoothed. The outputs from the first and second mean square value circuits are subtracted one from the other in a subtractor to obtain the measured output, with the triangular signal component removed. The measured output is applied to the second mean square value circuit to derive therefrom as a measured output an effective value that the root mean square value of the signal to be measured have been extracted.

11 Claims, 8 Drawing Figures

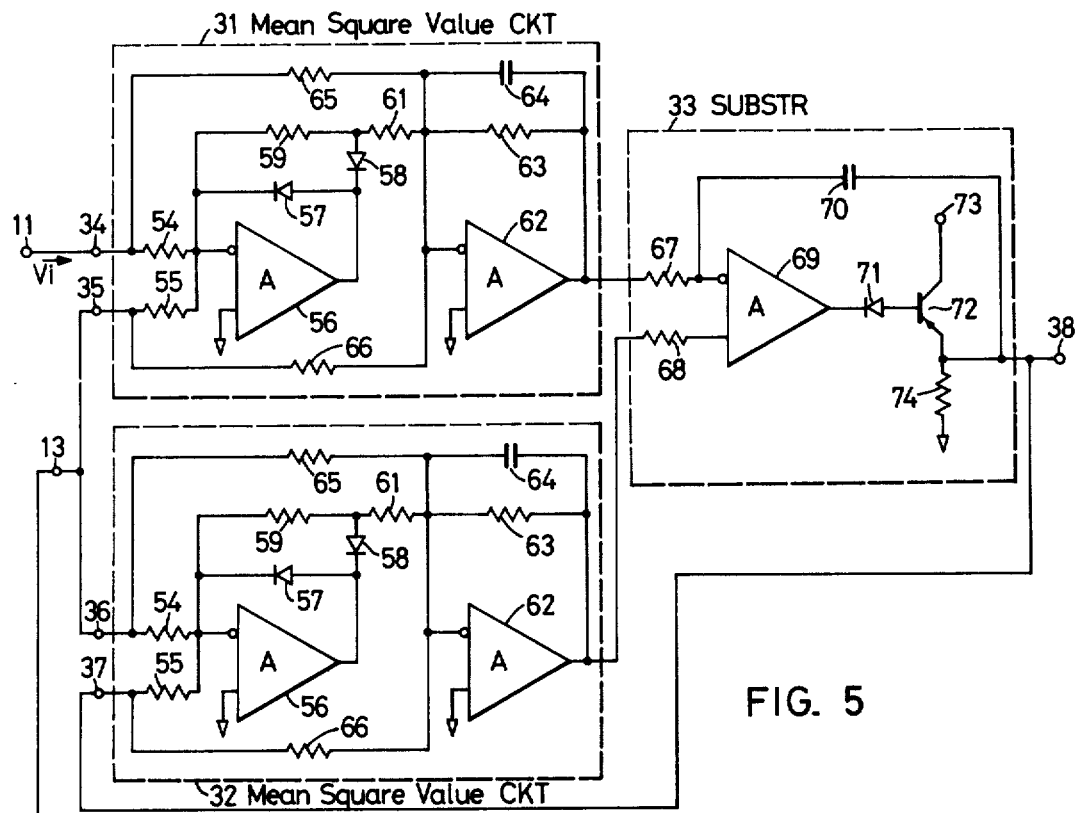
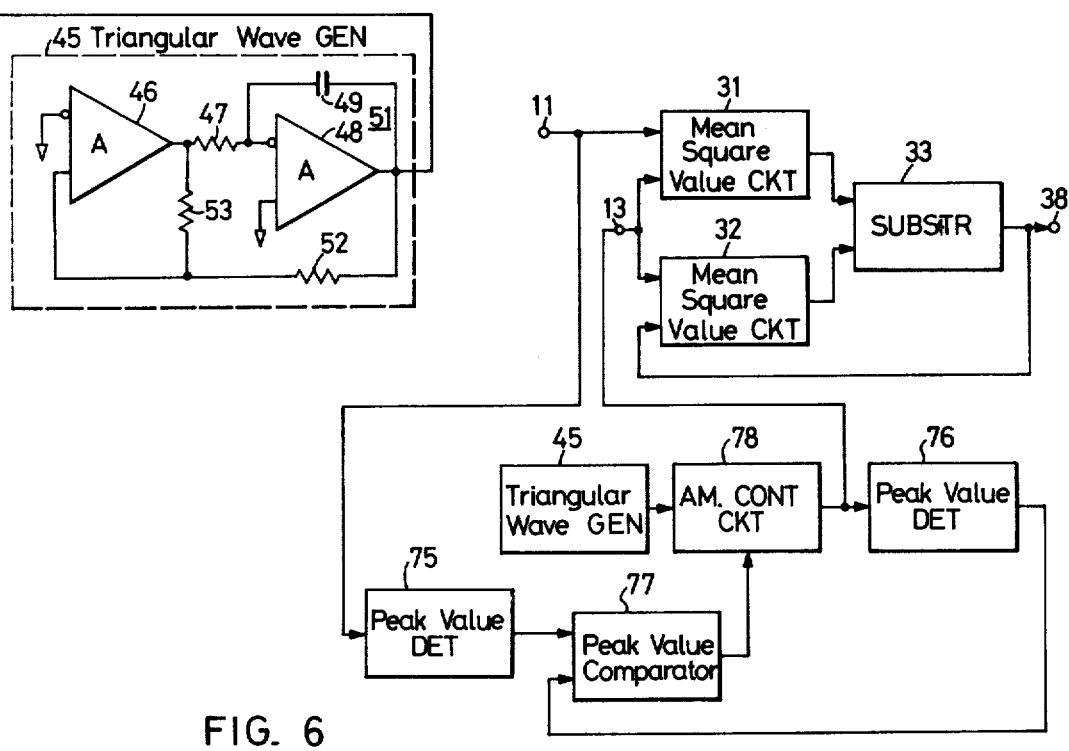
FIG. 5
FIG. 6

EFFECTIVE VALUE MEASURING APPARATUS

BACKGROUND OF THE INVENTION

This invention relates to an effective value measuring apparatus in which a triangular signal is superimposed on a signal to be measured and a mean value of the triangular signal is detected to obtain a square value of the signal to be measured, thereby measuring its effective value.

Various methods have heretofore been proposed for measuring an effective value of an alternating signal. One of the conventional methods that has been widely employed is to supply a signal to be measured to a heater and measure heat generation of the heater with a temperature sensitive element, such as a thermocouple or the like. But this method has the defects of large time lag due to the use of the heater, low accuracy owing to the use of the temperature sensitive element, susceptibility to the influence of the ambient temperature, etc.

Letting Vi and T represent a signal to be measured and its period, respectively, its effective value Ve is given by the following expression:

$$Ve = \sqrt{\frac{1}{T} \int_0^T Vi^2 dt} \quad (1)$$

This equation (1) shows that the effective value Ve can be obtained by squaring the signal to be measured Vi and extracting the square root of a mean value of its one period. Accordingly, the effective value can be measured by achieving the operation by the employment of electrical circuits. In such a case, a square circuit, i.e. a multiplier is needed for the signal to be measured but this method encounters the problems that the multiplier is generally complicated and that a highly accurate multiplier is not easily available.

On the other hand, the ratio between the areas of similar triangles is proportional to the ratio between the squares of the heights of the triangles. There is proposed, for example, in a Japanese magazine, Trans. Inst. Electronics Comm. Engrs. Japan, Pt. C, Vol. 59, CNo. 1, 1976 "Digital Effective Value Voltmeter with Wide Operation Range," a method of measuring the effective value Ve by utilizing the above fact, that is superimposing the signal to be measured on a triangular signal, averaging the triangular signal above a zero level, i.e. obtaining an output corresponding to the area of the triangular signal, to obtain the sum of squared values of the levels of respective peak points of the signal to be measured and extracting the square root of the above-said sum. With this effective value voltmeter, since the root-mean-square value of the signal to be measured Vi is obtained by using the triangular wave, no multiplier is needed and no time lag occurs unlike in the case of employing the heater and, on top of that, the effective value can be measured with higher accuracy than is obtainable with the use of the temperature sensitive element. But a change in the amplitude of the triangular signal causes a change in the root-mean-square value of the signal to be measured. Further, the square root extracting circuit used becomes relatively large in scale, in particular, for greater operation accuracy, the circuit becomes large-scaled and expensive. Moreover, since the output to be ultimately obtained is in the form of frequency indicating the effective value, a counter is required for measuring the frequency, so that a time standard is needed and if its accuracy is low, a large error is resulted.

A first object of this invention is to provide an effective value measuring apparatus which employs a triangular signal for obtaining the effective value of a signal to be measured and in which no measurement error occurs even if the amplitude of the triangular signal varies.

A second object of this invention is to provide an effective value measuring apparatus which is capable of accurate measurement even if the level of a signal to be measured greatly varies.

A third object of this invention is to provide an effective value measuring apparatus which is capable of accurate measurement regardless of the frequency of a signal to be measured.

A fourth object of this invention is to provide an effective value measuring apparatus which is relatively small in circuit scale, capable of accurate measurement and inexpensive.

A fifth object of this invention is to provide an effective value measuring apparatus which provides a measured apparatus which provides a measured output in the form of a voltage or current value and requires no time standard.

SUMMARY OF THE INVENTION

In accordance with this invention, a signal to be measured and a triangular signal are supplied to a first means square value circuit, which has the functions of superimposing the supplied two signals one on the other, full-wave rectifying the superimposed signal and smoothing the full-wave rectified signal. From the first mean square value circuit is obtained the sum of the value of the area of the absolute value of the triangular signal, i.e. its mean value, and the mean square value of the signal to be measured. The triangular signal and the measured output are applied to a second mean square value circuit, which has the same functions as the first mean square value circuit and from which is derived the sum of the value of the area of the absolute value of the triangular signal and the mean square value of the measured output. The outputs from the first and second mean square value circuits are subtracted one from the other in a subtractor, by which triangular signal components are cancelled each other, providing a measured output, that is, an output that the square root of the mean square value of the signal to be measured, has been extracted. In this manner, by using the triangular signal, the mean square value of the signal to be measured can easily be obtained and, by employing the two mean square value circuits and the subtractor, the triangular signal components are moved, so that the measured output is not affected by the amplitude of the triangular signal and, by feeding back the measured output to the second mean square circuit, the square root extracted output can be obtained.

The amplitude of triangular signal and that of the signal to be measured are compared by a comparator and, by the compared output, a level regulator is controlled, and then the triangular signal is provided to the level regulator to cause the amplitude of the triangular signal to coincide with that of the signal to be measured. The thus level controlled triangular signal is applied to the first and second mean square value circuits. With this, it is possible to accurately measure the effective value of the signal to be measured even if its amplitude greatly varies, that is, no matter how high or low level the signal may have, its effective value can be measured with great accuracy.

Further, means is employed for irregularly changing the period of the triangular signal; therefore, whatever frequency the signal to be measured may have, the triangular signal is not synchronized with the signal to be measured and the effective value can be measured with high accuracy. The triangular signal is generated by a known triangular wave generator composed of an integrator and a comparator. On the other hand, a noise source whose voltage changes irregularly is provided and, in synchronism with the inversion of the output from the comparator of the triangular wave generator, the output voltage from the noise source at that moment is added to the input to the integrator of the triangular wave generator. In this manner, the period of the triangular signal can be varied irregularly.

BRIEF DESCRIPTION OF THE DRAWINGS

FIG. 5 is a connection diagram illustrating an embodiment of the effective value measuring equipment of this invention;

FIG. 6 is a block diagram showing the basic construction of the effective value measuring equipment of this invention which is adapted to control the amplitude of a triangular signal in accordance with the amplitude of a signal to be measured;

DESCRIPTION OF THE PREFERRED EMBODIMENTS

Figure 1:
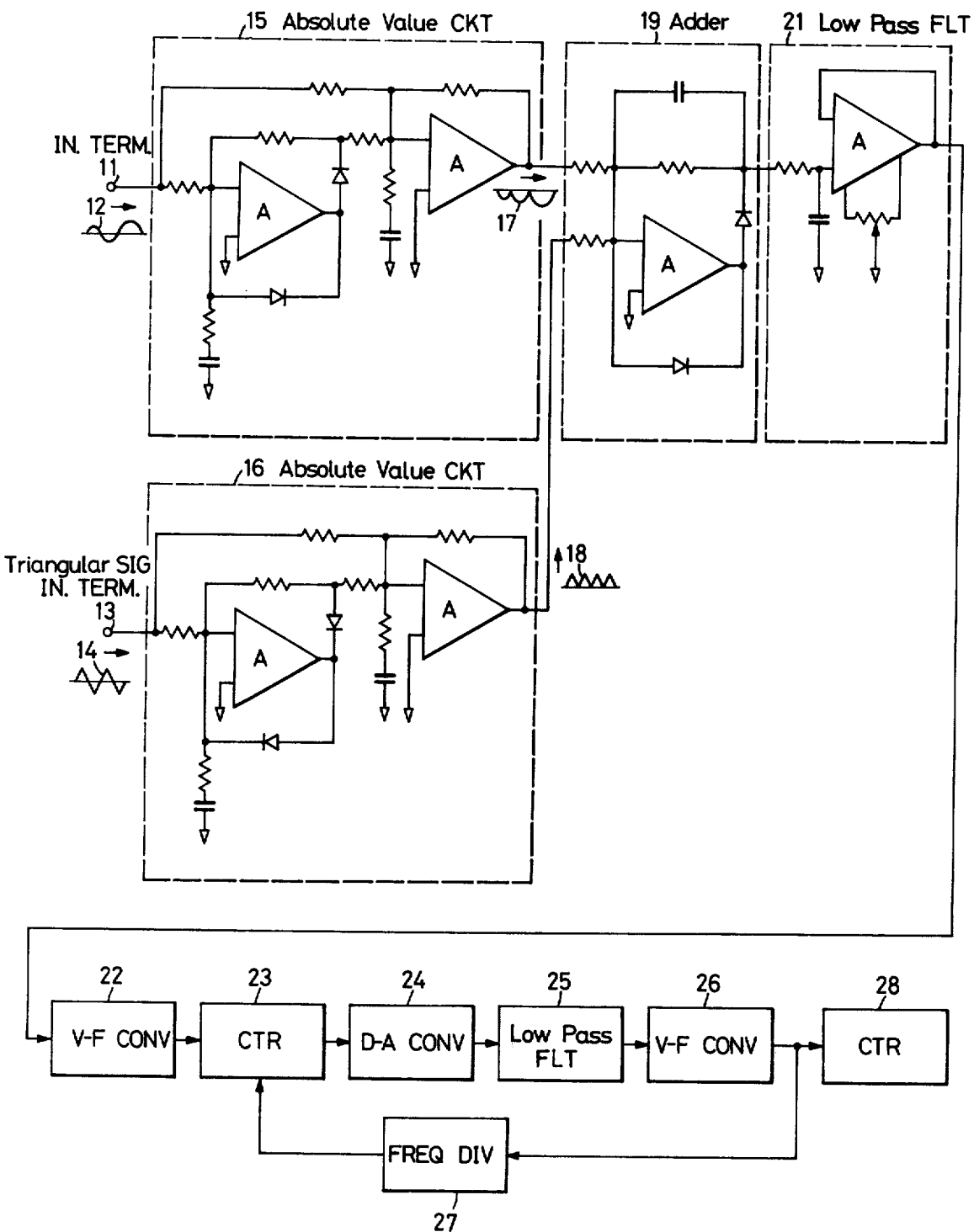
FIG. 1 is a schematic diagram showing a conventional effective value measuring equipment.

Referring first to FIG. 1, a brief description will be given of the conventional effective value measuring equipment set forth in the aforesaid magazine.

A signal to be measured 12 from an input terminal 11 therefor and a triangular signal 14 from a triangular signal input terminal 13 are respectively applied to absolute value circuits 15 and 16. In the absolute value circuits 15 and 16, the signal 12 is turned down to the negative side on a zero level and the triangular signal 14 is turned up to the positive side on a zero level. Absolute value signals 17 and 18 derived from the absolute value circuits 15 and 16, respectively, are added together by an adder 19, and the added output therefrom is smoothed by a low-pass filter 21 to provide at its output side a DC voltage corresponding to a mean square value of a voltage Vi of the signal 12 to be measured. The DC voltage thus obtained is converted by a voltage-to-frequency converter 22 to frequency signals, which are counted by a counter 23, whose output is converted by a D-A converter 24 to an analog signal. The analog signal is again provided via a low-pass filter 25 to a voltage-to-frequency converter 26 for reconversion to a frequency signal. The converted output is also applied to a frequency divider 27 and its frequency-divided output is supplied to the counter 23 to reset it. As a consequence, the output of the frequency from the voltage-to-frequency converter 26 becomes proportional to the square root of the frequency of the signal applied to the counter 23. The frequency of the output from the voltage-to-frequency converter 26 is measured by a counter 28, and the measured value is the effective value of the voltage Vi to be measured.

This conventional effective value measuring equipment provides the mean square value of the signal 12 to be measured by utilizing the triangular signal, and hence is capable of measuring the effective value with no time lag and with greater accuracy than in the case of employing a temperature sensitive element. However, this prior art apparatus has such a serious defect that level fluctuations of the triangular signal lead to variations in the mean square value $Vi^2$ of the signal 12 to be measured. Further, since use is made of the voltage-to-frequency converters 22 and 26, the counter 23, the D-A converter 24, the low-pass filter 25 and the frequency divider 27 for the square root extracting operation, the circuit structure becomes large in scale to increase contributing factors to error; and the apparatus becomes expensive for higher measurement accuracy. Moreover, as the final output is provided in the form of frequency, the frequency counter 28 is needed; therefore, a time standard is required for the frequency measurement and the accuracy of the time standard also becomes one of the factors to the error.

Figure 2:
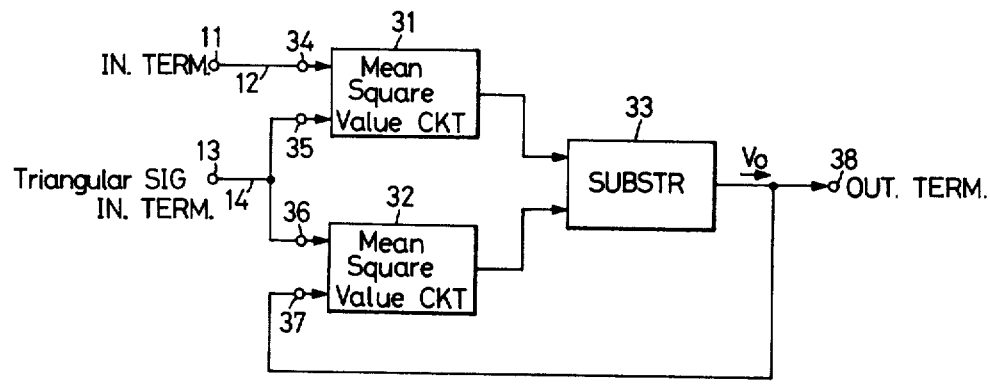
FIG. 2 is a block diagram illustrating the basic construction of an effective value measuring equipment of this invention.

FIG. 2 illustrates the outline of the effective value measuring apparatus of this invention, which comprises two mean square value circuits 31 and 32 which provide mean square values of an input signal using a triangular signal and a subtractor 33 which subtracts their outputs one from the other. The mean square value circuits 31 and 32 are identical in construction with each other and respectively have two input terminals 34, 35 and 36, 37. In the mean square value circuits 31 and 32, a triangular signal applied to the input terminals 35 and 36 from the terminal 13 and are respectively added with a signal supplied to the other input terminals 34 and 37, the absolute values of the added signals are obtained and the absolute value signals are smoothed; the mean square value circuits 31 and 32 respectively provide the sum of the mean square value of each of input signals to the input terminals 34 and 37 and a mean value of the original triangular signal.

To the other input terminal 34 of the mean square value circuit 31 is supplied the signal to be measured 12 from the input terminal 11 and to the other input terminal 37 of the mean square value circuit 31 is the output from the subtractor 33 is fed back. The output from the subtractor 33 is provided to a measured output terminal 38. The subtractor 33 may be, for example, a differential amplifier and is required to have a large gain.

Figure 3:
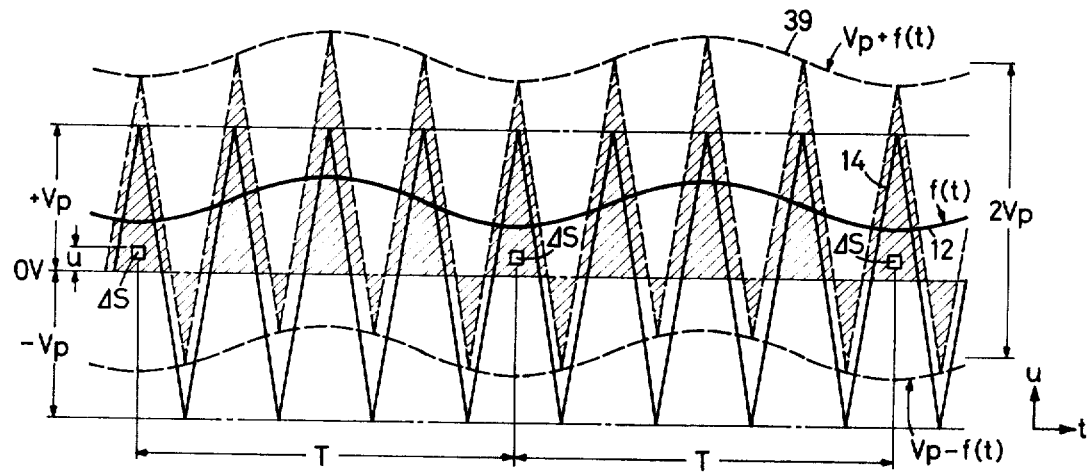
FIG. 3 is a diagram explanatory of the operation of the equipment depicted in FIG. 2.
Figure 4:
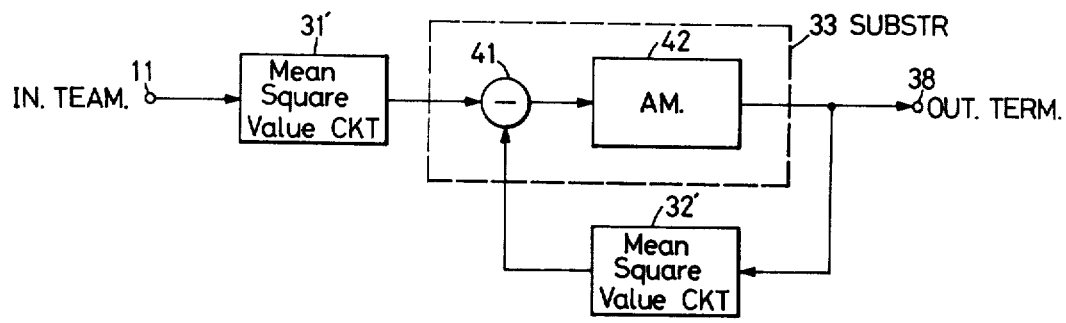
FIG. 4 is a block diagram showing an equivalent circuit of the equipment of FIG. 2.

Let it be assumed that the triangular signal 14 has positive and negative peaks $+Vp$ and $-Vp$, i.e. has a waveform with equal positive and negative values, as shown in FIG. 3, and that the signal to be measured 12 is zero. In each of the mean square value circuits 31 and 32, the triangular signal 14 is inverted in its negative side to obtain its absolute value and the absolute value signal is smoothed, by which is obtained a signal proportional to the area of the triangular wave whose absolute value was detected, that is, a mean value of the triangular signal 14. The outputs from the circuits 31 and 32 are equal to each other and subtracted by the subtractor 33 from each other to provide zero output at the measured output terminal 38. When the signal to be measured 12 is applied to the terminal 11, it is added to the triangular signal 14 in the mean square value circuit 31 to yield such a waveform as indicated by the curve 39 and its absolute value is obtained and smoothed, thereby obtaining the areas of the hatched triangles shown in FIG. 3. Since these triangles are similar, the ratio of their areas is in proportion to the ratio of the square of their height. The output from the mean square value circuit 31 is proportional to the mean square value of the added signal 39 and this mean square value is the sum of the mean square value is the sum of the original triangular signal 14 and that of the signal 12 to be measured. Where no input is applied to the terminal 37 of the mean square circuit 32, the mean value components of the triangular signal in the outputs from the mean square value circuits 31 and 32 are cancelled each other in the subtractor 33 to provide an output proportional to the mean square value of the signal 12 to be measured. The subtractor output is fed back to the terminal 37, whereby to derive an extracted value of the root mean square value of the signal 12 at the terminal 38. That is, in the mean square value circuits 31 and 32, the triangular signals are used for obtaining the mean square values of the signal 12 to be measured at the terminal 11 and the measured output at the terminal 38 and the triangular signals are cancelled each other; therefore, the effective value measuring apparatus as shown in FIG. 2 can be expressed equivalently, as depicted in FIG. 4. The signal to be measured Vi at the terminal 11 is subjected to the mean square operation in a mean square value circuit 31' and the measured output Vo at the output terminal 38 is subjected to the mean square value operation in a mean square value circuit 32'. The outputs $Vi^2$ and $Vo^2$ from the mean square value circuits 31' and 32' are subtracted one from the other in a subtractor part 41 of the subtractor 33 and the subtracted output is provided to the output terminal 38 via an amplifier 42 having a gain A. In FIG. 4, the following expression holds:

$$Vo = (Vi^2 - Vo^2)A \tag{2}$$

Solving the expression (2) in respect of Vo, it follows that $$Vo = \frac{-1 \pm \sqrt{1 + 4A^2 Vi^2}}{2A}$$

If the gain A is sufficiently large, it follows that $$Vo \simeq \pm \sqrt{Vi^2} \tag{3}$$

At the measured output terminal 38 is obtained the extracted value of the root mean square value of the signal to be measured, that is, the effective value of the signal. With the expression (3), positive and negative outputs are yielded and only one of them is used as the measured output.

The operation of the arrangement shown in FIG. 2 will be described in a little more detail.

Now, consider a small area $\Delta S$ which bears in-phase relationship to the signal to be measured $f(t)$. The probability P that the area $\Delta S$ is included in the triangular wave hatched in FIG. 3 increases as the area of the triangular wave at that position increases with an increase in the instantaneous value of the signal $f(t)$ in the very small area $\Delta S$. The probability P can be considered as the function of the position u of the very small area $\Delta S$ from the zero level O, as follows:

$$P(u) = \frac{u}{2Vp} \tag{4}$$

u takes the value from 0 to $Vp + f(t)$ and each point of the signal Vi has the probability density given by the expression (4). Accordingly, if the expression (4) is integrated over one period T of the signal Vi to obtain the average value, it becomes equal to a value obtained by averaging the hatched part over many periods. That is, $$\frac{1}{T} \sum_{\Delta S} P(u) S = \frac{1}{T} \sum_{\Delta t} \sum_{\Delta u} P(u) \Delta u \cdot \Delta t \tag{5}$$

the hatched part is divided into a positive and a negative part on both sides of the zero line 0—0. Letting Vo represent the average value of the sum total of the areas of the positive and negative parts, Vo = the average value of the positive part + the average value of the negative part; therefore, the expression (5) can be written as follows:

$$\frac{1}{T} \int_O^T \int_O^{Vp + f(t)} \frac{u}{2Vp} du, dt + \tag{6}$$
$$\frac{1}{T} \int_O^T \int_O^{Vp - f(t)} \frac{u}{2Vp} du, dt =$$
$$\frac{1}{T} \int_O^T \frac{1}{4Vp} [Vp + f(t)]^2 dt + \frac{1}{T} \int_O^T \frac{1}{4Vp} [Vp - f(t)]^2 dt =$$
$$\frac{1}{2T} \int_O^T [Vp + \frac{f(t)^2}{Vp}] dt$$

Subtracting the triangular components from the expression (6), it follows that $$\frac{1}{2VpT} \int_O^T [f(t)]^2 dt \tag{7}$$

This is a value proportional to the mean square value of the signal f(t). As described previously, in the arrangement shown in FIG. 2, the subtraction of the triangular components is achieved by the subtractor 33 and the subtracted output is fed back to the mean square value circuit 32, whereby the square root extracting operation is effected to provide the effective value of the signal Vi at the terminal 38, as indicated by the expression (3).

FIG. 5 illustrates a specific operative example of the apparatus depicted in FIG. 2. The triangular signal to be applied to the input terminal 13 is generated by a triangular wave generator 45, which may be a known one and in which, for example, a positive constant output from a comparator 46 is provided via an integrating resistor 47 to an inverted input side of an operational amplifier 48. An integrating capacitor 49 is connected between the inverted input side and the output side of the operational amplifier 48 and its non-inverted input side is grounded, thereby making up an integrator 51. The positive constant output $V_H$ from the comparator 46 is integrated in accordance with a time constant which is determined by the resistor 47 and the capacitor 49 and the output from the integrator 51 linearly decreases. The integrated output is applied via a resistor 52 to a non-inverted input side of the comparator 46 and, to this non-inverted side, the output from the comparator 46 is also provided via a resistor 53, and an inverted input side of the comparator 46 is grounded. Consequently, when the output from the integrator 51 becomes a negative constant value $-Vp$, the sum of a voltage divided value of the output from the integrator 51, which is applied to the non-inverted input side of the comparator 46, and a voltage divided value of the output from the comparator 46 passes through the zero level to become negative, by which the output from the comparator 46 is inverted to a negative constant value $-V_L$, which is voltage divided and applied to the non-inverted input side of the comparator 46. At the same time, the constant negative voltage $-V_L$ is integrated by the integrator 51 and its output starts to linearly increase. When this integrated output reaches the positive constant value $+Vp$, the sum of it and the negative constant value $-V_L$ of the comparator 46 passes through the zero level to become positive. As a result of this, the output from the comparator 46 becomes the positive constant value $+V_H$ and the output from the integrator 51 starts to linearly decrease from the positive constant value $+Vp$. The above operations are repeatedly carried out, by which a triangular signal varying between $+Vp$ and $-Vp$ is provided at the output side of the integrator 51.

The triangular signal thus obtained is provided to the terminals 35 and 36 of the mean square value circuits 31 and 32. Since the mean square value circuits 31 and 32 are identical in construction with each other, a description will be given of an example of the circuit 31. The terminals 34 and 35 are respectively connected via adding resistors 54 and 55 to an inverted input side of an operational amplifier 56, whose non-inverted input side is grounded and whose output side is connected to the inverted input side via a diode 57, a diode 58 having the reverse polarity therefrom and a resistor 59. The connection point between the diode 58 and the resistor 59 is connected via a resistor 61 to the inverted input side of an operational amplifier 62, whose non-inverted input side is grounded and, between its inverted input side and output side is connected a parallel circuit of a resistor 63 and a capacitor 64. The inverted input side of the operational amplifier 62 is connected to the terminals 34 and 35 via resistors 65 and 66, respectively. If the capacitor 64 and the resistors 54 and 65 or 55 and 66 are removed from the above arrangement, it is identical in construction with a known absolute value circuit, that is, a circuit for the full rectification of an input; and by the additional provision of the capacitor 64, the absolute value of the input is obtained and, at the same time, it is smoothed. Further, with the provision of the resistors 54, 65 and 55, 66, it is possible to obtain a function of adding together the both inputs at the terminals 34 and 35, a function of obtaining the absolute value of the added input and a function of smoothing it. In the mean square circuit 31, it is possible to perform the adding function, the absolute value obtaining function and the smoothing function by individual circuits, or two of the functions by one circuit and the other by another circuit. As the mean square value circuit 32 is identical in construction with the circuit 31, the parts corresponding to those in the latter are identified by the same reference numerals.

To the terminal 34 of the mean square value circuit 31 is supplied the signal to be measured from the terminal 11 and to the terminal 37 of the mean square value circuit 32 is provided the measured output from the terminal 38. In the mean square value circuits 31 and 32, the triangular signal is added to the signal to be measured and the measured output, respectively and the absolute values of the added values are obtained and further smoothed.

The outputs from the mean square value circuits 31 and 32 are respectively provided to the inverted input side and the non-inverted input side of the operational amplifier 69 via resistors 67 and 68 in the subtractor 33. At the output side of the operational amplifier 69 is derived an output that the outputs from the mean square value circuits 31 and 32 are subtracted one from the other. The subtracted output is applied via a diode 71 to the base of a transistor 72 of the emitter follower structure, the transistor 72 having its collector connected to a power source terminal 73 and its emitter grounded via a resistor 74. The positive side of the output from the operational amplifier 69 is cut off by the diode 71 and the negative side is derived as the measured output from the emitter of the transistor 72 at the output terminal 38. A capacitor 70 connected between the output terminal 38 and the inverted input side of the operational amplifier 69 achieves a negative feedback for a transient input to prevent oscillation.

In the above, the amplitude of the triangular signal is considered as fixed. However, it is required that as described previously, the very small area $\Delta S$ be always included in the amplitude of the triangular signal in FIG. 3. Accordingly, if the amplitude of the signal to be measured Vi increases to exceed the amplitude of the triangular signal, an error occurs in the measured value. To avoid this, it is considered to preset the amplitude 2Vp of the triangular signal sufficiently large so that the amplitude of the signal Vi does not exceed the amplitude of the triangular signal. But where the amplitude of the signal Vi is very small, its ratio to the amplitude of the triangular signal becomes markedly small to increase the error. Accordingly, it is desirable that the amplitude of the signal Vi and that 2Vp of the triangular signal are always in agreement with each other.

FIG. 6 shows a basic arrangement designed so that the amplitude of the triangular signal automatically coincides with that of the signal to be measured. In this example, there are provided a first peak value detector 75 for detecting the peak value of the signal to be measured Vi and a second peak value detector 76 for detecting the peak value of the triangular signal. The detected outputs from the peak value detectors 75 and 76 are compared by a peak value comparator 77 with each other and, by the compared output, an amplitude control circuit 78 is controlled. The triangular signal yielded from the triangular wave generator 45 is provided via the amplitude control circuit 78 to the terminal 13 and the peak value control circuit 76, with the result that the amplitude control circuit 78 is controlled so that the peak value of the triangular signal provided from the amplitude control circuit 78 is always equal to the peak value of the signal Vi.

With such an arrangement, even if the level of the signal Vi greatly varies, its effective value can always be measured under the best conditions and the dynamic range of measurement is increased.

Figure 7:
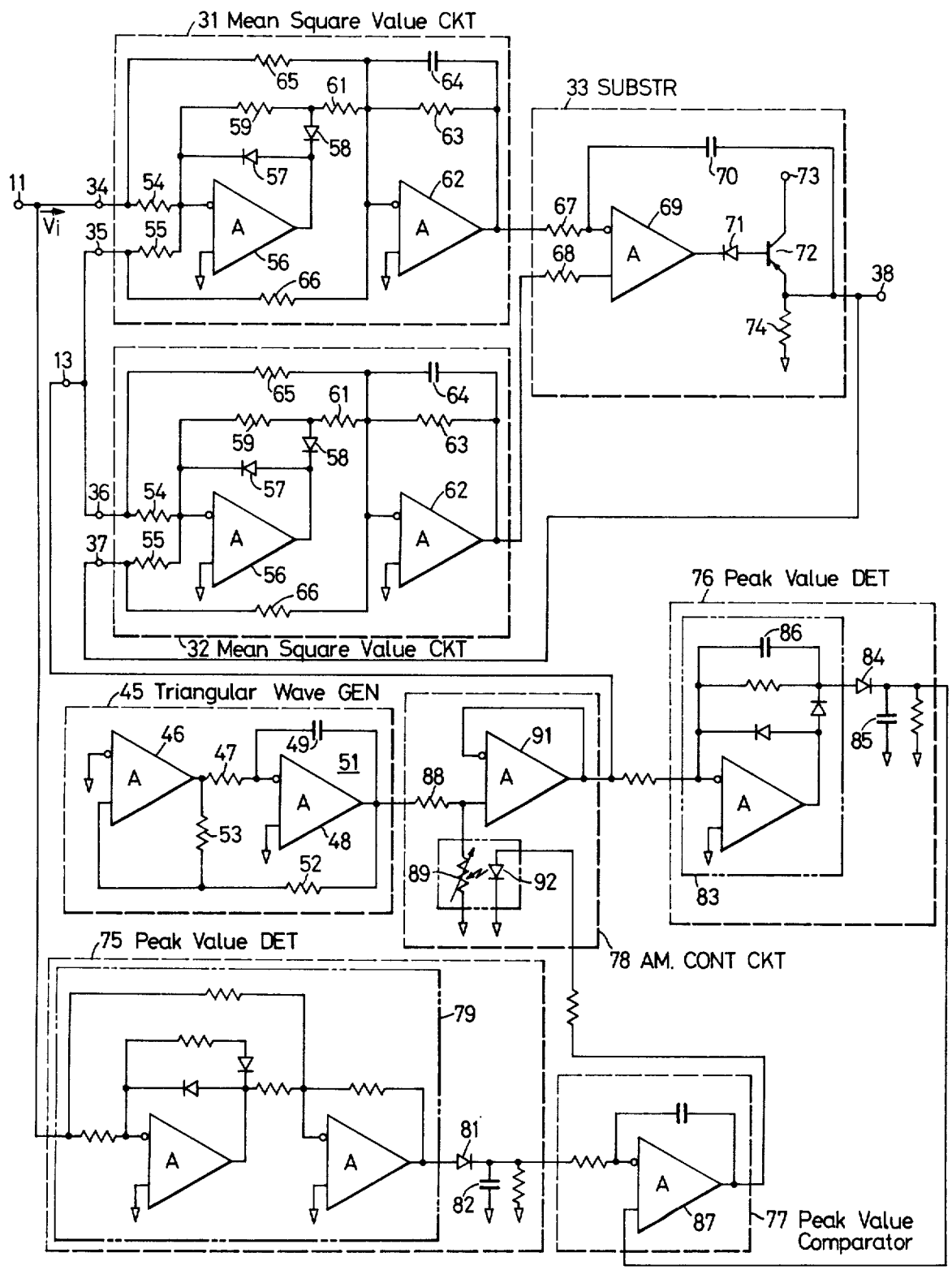
FIG. 7 is a connection diagram illustrating an embodiment of the equipment depicted in FIG. 6.

FIG. 7 illustrates a specific operative example of the apparatus depicted in FIG. 6, and the parts corresponding to those in FIGS. 5 and 6 are marked with the same reference numerals. In the peak value detector 75, the signal to be measured Vi is provided to an absolute value circuit 79 for full-wave rectification and the rectified output is applied via a reverse current blocking diode to a capacitor 82. In the capacitor 82 is held that one of the positive and negative peak values which is larger in absolute value than the other. The triangular signal derived from the amplitude control circuit 78 is inverted by a half-wave rectifier 83 only in the negative side and derived as a positive output, thereafter being provided as a reverse current blocking diode 84 to a capacitor 85. Unlike the signal to be measured, the triangular signal has exactly the same waveform in the positive and in the negative side, so that the peak value of only one of them is retained in the capacitor 85. In order that the peak value held in the capacitor 85 may not greatly vary, a capacitor 86 is provided in a feedback circuit of the half-wave rectifier 83 to derive therefrom a little smoothed rectified output.

The detected values derived from the peak value detectors 75 and 76 are respectively applied to an inverted and a non-inverted input side of an operational amplifier 87 of the comparator 77 for comparison. In the amplitude control circuit 78, the output side of the triangular wave generator 45 is grounded via a resistor 88 and a photoconductive cell 89, such as CdS, the resistor 88 and the photoconductive cell 89 forming a variable attenuator. The output from the attenuator is provided via a buffer amplifier 91 to the terminal 13 and the peak value detector 76. The output from the comparator 77 is grounded via a light emitting device 92 and its light is applied to the photoconductive cell 89. For example, when the peak value of the signal to be measured increases, the output from the comparator 77 decreases and attenuation of the triangular signal by the resistor 88 and the photoconductive cell 89 decreases to cause an increase in the amplitude of the triangular signal which is provided to the terminal 12. In this manner, the amplitudes of the signal to be measured and the triangular signal are caused to coincide with each other at all times. The amplitude control circuit is not limited specifically to controlling of the attenuation of a variable attenuator but may also be designed to control the gain of a variable gain amplifier.

Figure 8:
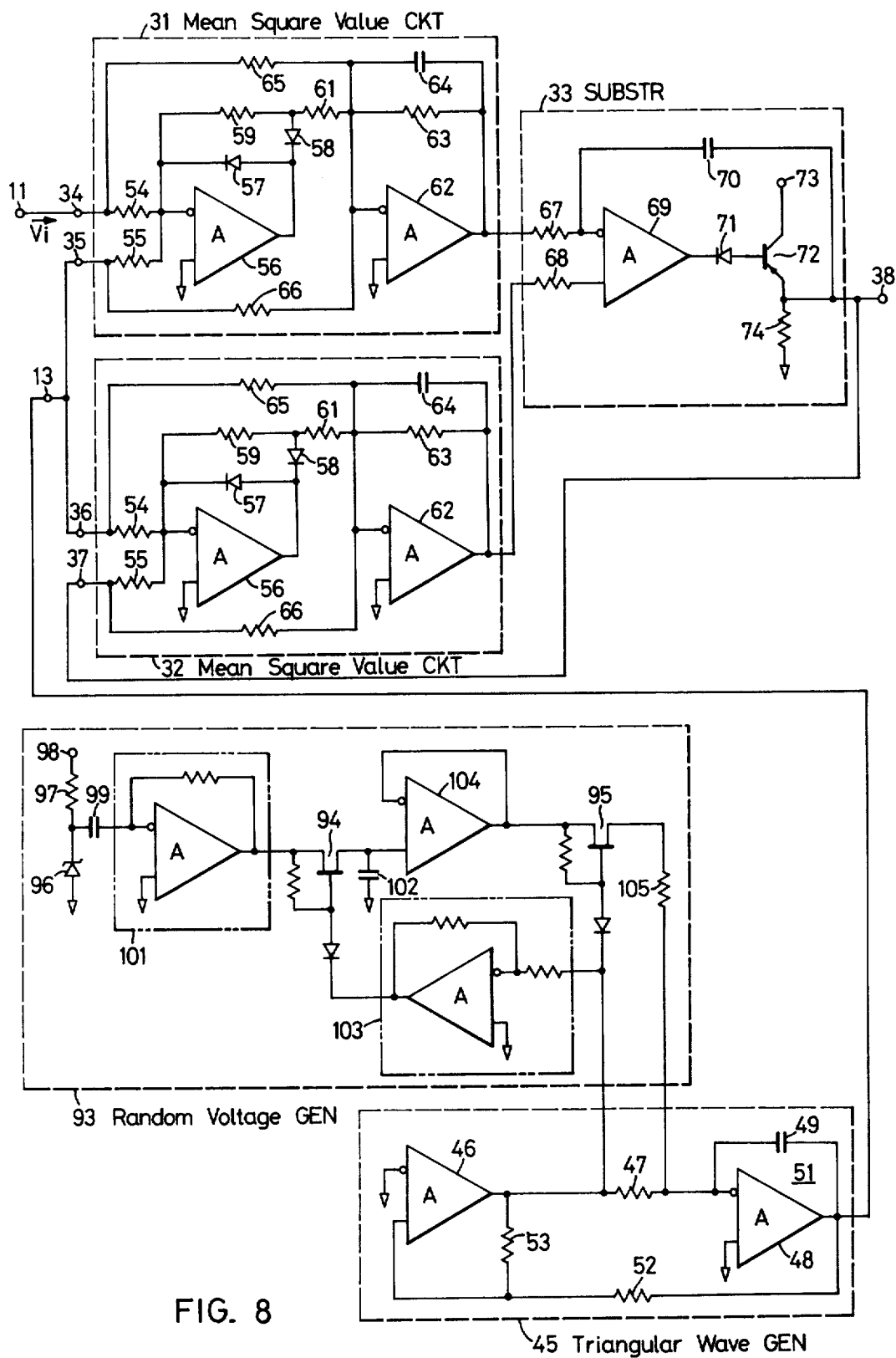
FIG. 8 is a connection diagram showing a modified form of the effective value measuring equipment of this invention which is designed to irregularly change the period of the triangular signal.

As will be understood from the description given in respect of FIG. 3 previously, if the triangular signal and the signal to be measured are synchronized with each other, measurement of the effective value is impossible. This problem can be solved by changing the period of the triangular signal irregularly. For example, as shown in FIG. 8 in which parts corresponding to those in FIG. 5 are identified by the same reference numerals, there is provided a random voltage generator 93 whose output voltage changes irregularly. The output voltage of the random voltage generator 93 is applied to the triangular signal generator 45 in synchronism with the triangular output from the triangular signal generator 45 to change its period. For example, there are provided in the random voltage generator 93 FET switches 94 and 95 which operate in reverse directions on the output from the comparator 46. Through the FET switches 94 and 95, an irregularly changing voltage is added to the input voltage of the integrator 51 in synchronism with the period of the triangular signal. The cathode of a Zener diode 96 is connected via a resistor 97 to a positive power source terminal 98, by which the Zener diode 96 is held in backward conductive state. From the connection point of the Zener diode 96 and the resistor 97, a white noise generated by the Zener diode 96 is lead out through a capacitor 99. This white noise, as required, is amplified by an amplifier 101 and applied via the switch 94 to a capacitor 102. To the gate of the FET switch 94 is supplied the output from the comparator 46 via an inverter 103. As a consequence, the switch 94 is controlled to be turned ON or OFF depending upon whether the output from the comparator 46 is negative or positive. When the integrator 48 is inverted from the negative voltage integrating state to the positive voltage integrating state, the level of the white noise produced from the Zener diode 96 immediately before the inversion is stored in the capacitor 102. The voltage stored in the capacitor 102 is provided via a buffer amplifier 104 to the switch 95. The switch 95 performs an operation reverse from that of the switch 94. Accordingly, when the integrator 51 is in the positive voltage integrating state, the switch 95 in turned ON and the voltage stored in the capacitor 102 is added via a resistor 105 to the input of the integrator 51. The voltage stored in the capacitor 102 is based on the white noise and hence irregularly changes. Accordingly the voltage value which is added through the switch 95 while the integrator 51 integrates the positive output from the comparator 46, also changes irregularly to cause an irregular change in the integration period. Since the switch 95 is in the OFF state while the output from the comparator 46 is negative, the integration period of the integrator 51 is constant in such a case, but in the case of the output from the comparator 46 being positive, the integration period changes irregularly, so that the period of the triangular signal derived from the triangular wave generator 45 varies irregularly. As a result of this, whatever frequency the signal to be measured may have, the triangular signal is not synchronized with the signal to be measured and the effective value is correctly measured at all times.

As has been described in the foregoing, according to the effective value measuring apparatus of this invention, by using a triangular signal, the mean square value of a signal to be measured can be obtained without employing a multiplier circuit; therefore, the effective value measuring apparatus is simple in circuit construction but high in accuracy and inexpensive. In addition, the two mean square value circuits 31 and 32 are used and the triangular wave components are removed by the subtractor 33, so that even if the amplitude of a triangular signal varies, a correct effective value can be obtained without being affected by the amplitude variation. Further, by feeding back the measured output to the one mean square value circuit 32, the extraction of the root mean square value of the signal to be measured is achieved without a digital square root extracting operation which requires the use of such a complicated and large-scale circuit as shown in FIG. 1, and the effective value measuring apparatus of this invention does not need any time standard and has few factors to error and high accuracy.

Moreover, by causing the amplitude of a triangular signal to automatically coincide with the amplitude of a signal to be measured, the measurable dynamic range of the signal to be measured can be increased and, by irregularly changing the period of the triangular signal, accurate measurement can be effected regardless of the frequency of the signal to be measured. The arrangement shown in FIG. 7 may also be modified so that the period of the triangular signal is irregularly changed as in the case of FIG. 8.

It will be apparent that many modifications and variations may be effected without departing from the scope of the novel concepts of this invention.

What is claimed is:

1. An effective value measuring apparatus comprising:
   a triangular wave generator for generating a triangular signal whose positive and negative waveforms are symmetrical with each other;
   a first mean square value circuit connected to the output side of the triangular wave generator and supplied with the triangular signal and a signal to be measured for adding these signals into a composite signal, full-wave rectifying the signal and smoothing the rectified signal;
   a second mean square value circuit connected to the output side of the triangular wave generator and supplied with the triangular signal and a measured output signal for adding these signals into a composite signal, full-wave rectifying the signal and smoothing the rectified signal; and
   a subtractor connected to the output sides of the first and second mean square value circuits for subtracting their outputs one from the other, supplying the subtracted output to a measured output terminal and applying the subtracted output as the measured output signal to the second mean square value circuit.

2. An effective value measuring apparatus according to claim 1, which further comprises:
   a first peak value detector for detecting the peak value of the signal to be measured;
   an amplitude control circuit connected to the output side of the triangular wave generator for controlling the amplitude of the triangular signal and supplying the amplitude-controlled triangular signal to the first and second mean square value circuits;
   a second peak value detector for detecting the peak value of the amplitude-controlled triangular signal; and
   a comparator connected to the output sides of the first and second peak value detectors for detecting the difference between the detected peak values and supplying the detected difference as a control signal to the amplitude control circuit to cause the controlled amplitude of the triangular signal to coincide with the amplitude of the signal to be measured.

3. An effective value measuring apparatus according to claim 2, wherein the first peak value detector comprises a full-wave rectifier for full-wave rectifying the signal to be measured and a circuit for holding the peak value of the full-wave rectified output and detects that one of the positive and negative peak values which is larger in absolute value than the other.

4. An effective value measuring apparatus according to claim 2, wherein the second peak value detector comprises a half-wave rectifier for half-wave rectifying the triangular signal and a circuit for holding the peak value of the rectified output.

5. An effective value measuring apparatus according to claim 4, wherein the half-wave rectifier includes means for slightly smoothing the rectified output.

6. An effective value measuring apparatus according to claim 1, wherein the triangular wave generator includes means for irregularly changing the period of the output triangular signal.

7. An effective value measuring apparatus according to claim 6, wherein the triangular wave generator comprises a comparator supplied at one input side with a reference value, an integrator supplied with the comparator output as an input for integration to supply the integrated output and the comparator output in a superimposed form to the other input side of the comparator, and a random voltage generator for generating a random voltage and applying the random voltage to the input of the integrator in synchronism with the period of the triangular signal to thereby changing the period of the triangular signal.

8. An effective value measuring apparatus according to claim 7, wherein the random voltage generator comprises a Zener diode conducted in a backward direction, a first switch controlled by the output from the comparator of the triangular wave generator to apply random noises produced by the Zener diode to a holding capacitor, and a second switch controlled by the output from the comparator to supply the voltage held in the holding capacitor as the integration input to the integrator.

9. An effective value measuring apparatus according to claims 1, 2 or 6, wherein the first and second mean square value circuits have the same construction and respectively comprise an adder including a first operational amplifier for adding together two inputs thereto, an absolute value circuit comprising the adder, a pair of diodes of reverse polarities inserted in a negative feedback circuit of the first operational amplifier and a second operational amplifier for adding together the output and input of the first operational amplifier, and a smoothing circuit comprising the second operational amplifier and a smoothing capacitor connected to a negative feedback circuit of the second operational amplifier.

10. An effective value measuring apparatus according to claims 1, 2 or 6, wherein the subtractor is a differential amplifier of sufficiently large gain for differentially amplifying the outputs from the first and second mean square value circuits.

11. An effective value measuring apparatus according to claim 10, which includes a circuit for supplying the measured output terminal with the output of only one polarity in the output from the differential amplifier.

* * * * *